United States Patent
Wei et al.

(10) Patent No.: US 11,366,147 B2
(45) Date of Patent: Jun. 21, 2022

(54) MOTOR STATOR RESISTANCE CALCULATION

(71) Applicant: Rockwell Automation Technologies, Inc., Mayfield Heights, OH (US)

(72) Inventors: Lixiang Wei, Mequon, WI (US); Bing Li, Mequon, WI (US); Jacob Lamb, Mequon, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 140 days.

(21) Appl. No.: 17/010,624

(22) Filed: Sep. 2, 2020

(65) Prior Publication Data

US 2022/0065909 A1 Mar. 3, 2022

(51) Int. Cl.
*H02P 21/14* (2016.01)
*G01R 27/08* (2006.01)
*H02P 23/14* (2006.01)
*H02P 27/06* (2006.01)

(52) U.S. Cl.
CPC .............. *G01R 27/08* (2013.01); *H02P 23/14* (2013.01); *H02P 27/06* (2013.01)

(58) Field of Classification Search
CPC ......... G01R 27/08; H02P 23/14; H02P 27/06; H02P 21/14
See application file for complete search history.

(56) References Cited

U.S. PATENT DOCUMENTS

2016/0181961 A1* 6/2016 Holmburg ............... H02P 21/14
                                                                  318/400.02
2019/0242934 A1   8/2019 Leggate et al.

FOREIGN PATENT DOCUMENTS

CN        102291080 A       12/2011
KR     20090067919 A   *    6/2009
WO       03047084 A1        6/2003

OTHER PUBLICATIONS

"European Search Report", EPO, dated Feb. 2, 2022, pp. 1-8.
G. Shen, "Automeasurement of the Inventor Output Voltage Delay Curve to Compensate for Inverter Nonlinearity in Sensorless Motor Drives", IEEE Transactions on Power Electronics, vol. 29, No. 10, Oct. 2014, pp. 5542-5553.

* cited by examiner

*Primary Examiner* — Cortez M Cook
(74) *Attorney, Agent, or Firm* — Scott D. Thorpe

(57) ABSTRACT

For motor stator resistance calculation, a method estimates an output voltage using a Direct Current (DC) bus voltage and a duty ratio for a motor drive at a first switching frequency and at least one second switching frequency. The method measures an output current at the first switching frequency and the at least one second switching frequency. The method calculates a first stator resistance for the first switching frequency and at least one second stator resistance for the at least one second switching frequency. The method estimates a stator resistance at a DC condition based on the first stator resistance and the at least one second stator resistance. The method sets a dynamic compensation based on a stator resistance error between the first switching frequency and the at least one second switching frequency.

20 Claims, 8 Drawing Sheets

MOTOR STATOR RESISTANCE CALCULATION

BACKGROUND INFORMATION

The subject matter disclosed herein relates to motor stator resistance calculation.

BRIEF DESCRIPTION

A method for motor stator resistance calculation is disclosed. The method estimates an output voltage using a Direct Current (DC) bus voltage and a duty ratio for a motor drive at a first switching frequency and at least one second switching frequency. The method measures an output current at the first switching frequency and the at least one second switching frequency. The method calculates a first stator resistance for the first switching frequency and at least one second stator resistance for the at least one second switching frequency. The method estimates a stator resistance at a DC condition based on the first stator resistance and the at least one second stator resistance. The method sets a dynamic compensation based a stator resistance error between the first switching frequency and the at least one second switching frequency.

An apparatus for motor stator resistance calculation is also disclosed. The apparatus includes a processor and a memory. The processor estimates an output voltage using a DC bus voltage and a duty ratio for a motor drive at a first switching frequency and at least one second switching frequency. The processor measures an output current at the first switching frequency and the at least one second switching frequency. The processor calculates a first stator resistance for the first switching frequency and at least one second stator resistance for the at least one second switching frequency. The processor estimates a stator resistance at a DC condition based on the first stator resistance and the at least one second stator resistance. The processor sets a dynamic compensation based on a stator resistance error between the first switching frequency and the at least one second switching frequency.

A computer program product for motor stator resistance calculation is also disclosed. The computer program product includes non-transitory computer readable storage medium having program code embodied therein, the program code readable/executable by a processor. The processor estimates an output voltage using a DC bus voltage and a duty ratio for a motor drive at a first switching frequency and at least one second switching frequency. The processor measures an output current at the first switching frequency and the at least one second switching frequency. The processor calculates a first stator resistance for the first switching frequency and at least one second stator resistance for the at least one second switching frequency. The processor estimates a stator resistance at a DC condition based on the first stator resistance and the at least one second stator resistance. The processor sets a dynamic compensation based on a stator resistance error between the first switching frequency and the at least one second switching frequency.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1A:
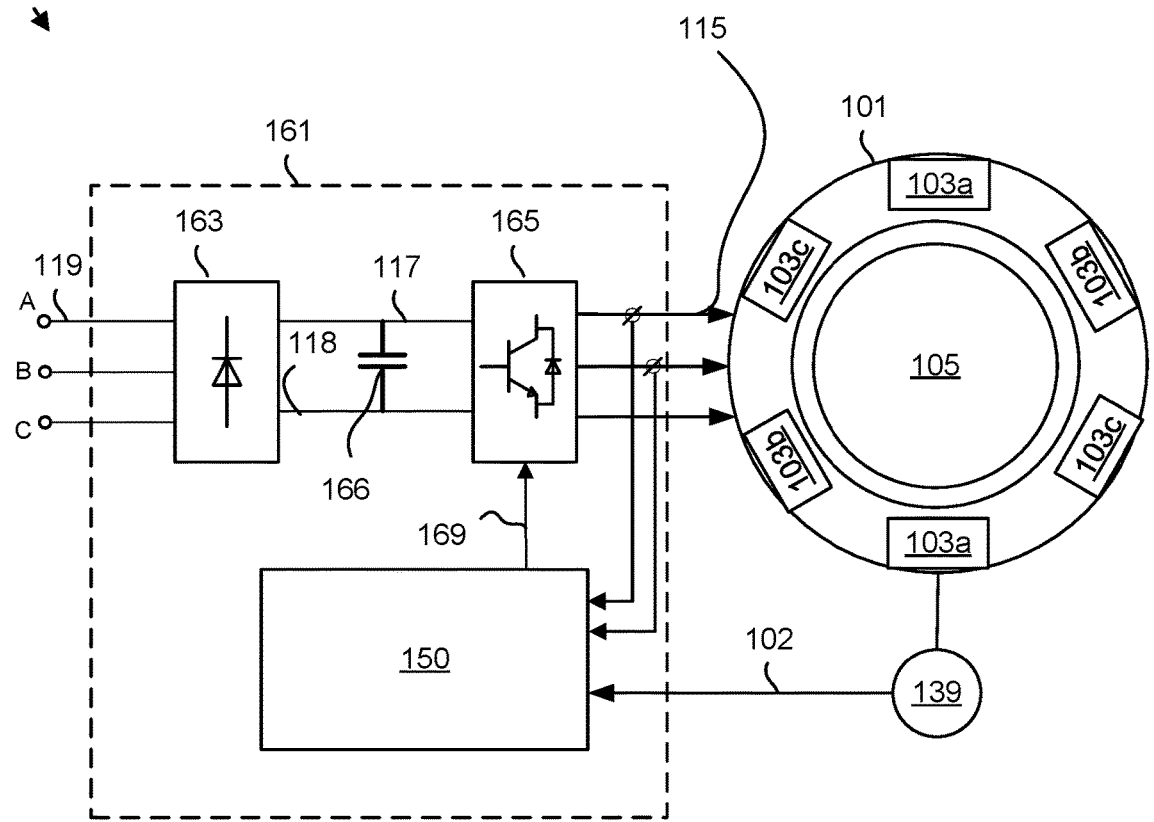
FIG. 1A is a schematic block diagram of motor system according to an embodiment.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. The term "and/or" indicates embodiments of one or more of the listed elements, with "A and/or B" indicating embodiments of element A alone, element B alone, or elements A and B taken together.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, in order to emphasize their implementation independence more particularly. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function. Nevertheless, the executables of an identified module need not be physically located together but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules and may be embodied in any suitable form and organized within any suitable type of data structure. The operational data may be collected as a single data set or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer readable medium may be a tangible computer readable storage medium storing the program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable storage medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store program code for use by and/or in connection with an instruction execution system, apparatus, or device.

The computer readable medium may also be a computer readable signal medium. A computer readable signal medium may include a propagated data signal with program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport program code for use by or in connection with an instruction execution system, apparatus, or device. Program code embodied on a computer readable signal medium may be transmitted using any appropriate medium, including but not limited to wireline, optical fiber, Radio Frequency (RF), or the like, or any suitable combination of the foregoing In one embodiment, the computer readable medium may comprise a combination of one or more computer readable storage mediums and one or more computer readable signal mediums. For example, program code may be both propagated as an electro-magnetic signal through a fiber optic cable for execution by a processor and stored on RAM storage device for execution by the processor.

Program code for carrying out operations for aspects of the present invention may be written in any combination of one or more programming languages, including an object oriented programming language such as Python, Ruby, R, Java, Java Script, Smalltalk, C++, C sharp, Lisp, Clojure, PHP or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). The computer program product may be shared, simultaneously serving multiple customers in a flexible, automated fashion.

The computer program product may be integrated into a client, server and network environment by providing for the computer program product to coexist with applications, operating systems and network operating systems software and then installing the computer program product on the clients and servers in the environment where the computer program product will function. In one embodiment software is identified on the clients and servers including the network operating system where the computer program product will be deployed that are required by the computer program product or that work in conjunction with the computer program product. This includes the network operating system that is software that enhances a basic operating system by adding networking features.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

The embodiments may transmit data between electronic devices. The embodiments may further convert the data from a first format to a second format, including converting the data from a non-standard format to a standard format and/or converting the data from the standard format to a non-standard format. The embodiments may modify, update, and/or process the data. The embodiments may store the received, converted, modified, updated, and/or processed data. The embodiments may provide remote access to the data including the updated data. The embodiments may make the data and/or updated data available in real time. The embodiments may generate and transmit a message based on the data and/or updated data in real time.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by program code. The program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The program code may also be loaded onto a computer, other programmable data processing apparatus, or other devices to cause a series of operational steps to be performed on the computer, other programmable apparatus or other devices to produce a computer implemented process such that the program code which executed on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods, and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

The description of elements in each figure may refer to elements of proceeding figures. Like numbers refer to like elements in all figures, including alternate embodiments of like elements.

FIG. 1A is a schematic diagram of motor system 100. The system 100 includes a motor 101 and a motor drive 161. The motor 101 may be a salient motor 101. The motor 101 may be controlled by the motor drive 161.

In the depicted embodiment, the motor 101 includes a salient rotor 105 and a plurality of coils 103a-c. The motor drive 161 may direct electric currents with an output voltage 115 through the coils 103a-c to generate a motor flux that drives the rotor 105.

Figure 4:
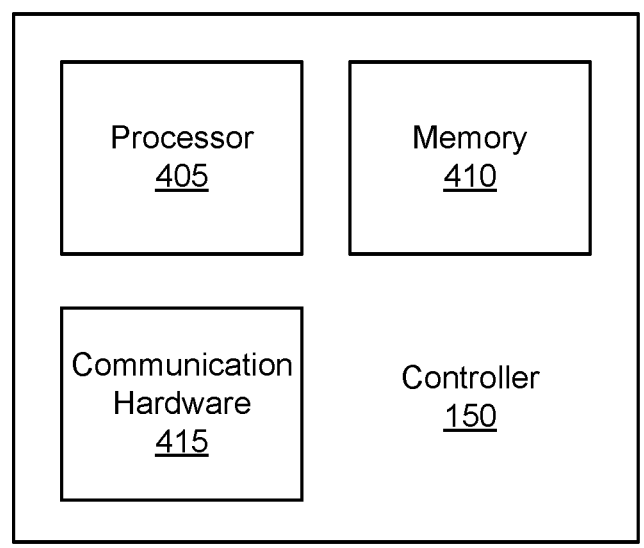
FIG. 4 is a schematic block diagram of a controller according to an embodiment.

The motor drive 161 may control the motor 101 to generate torque at a specified angular velocity. The motor drive 161 may be required to control the motor 101 within a range of torques and/or angular velocities for a variety of loads. In the depicted embodiment, the motor drive 161 includes a rectifier and/or converter 163, referred to hereafter as a rectifier 163, an inverter 165, a bus capacitor 166, and a controller 150. The converter 163 supplies Direct Current (DC) bus voltage 117 and a neutral 118 to the inverter 165. A capacitor 166 may filter the DC bus voltage 117. The controller 150 may include a processor as shown in FIG. 4. The controller 150 may produce the gate signals 169 to control the output voltage 115 supplied by the inverter 165, and therefore control the motor 101. The system 100 may include an encoder 139 that generates a position signal 102. The position signal 102 may be used accurately control the motor 101. In a certain embodiment, at least a portion of the motor drive 161 comprises one or more of hardware and executable code, the executable code stored on one or more computer readable storage media.

The motor system 100 does not include voltage sensing circuits to determine an output voltage 115. As a result, the output voltage 115 is estimated. In the past, the output voltage 115 could not be accurately predicted because of nonlinear characteristics of the inverter 165. Because of output voltage estimation inaccuracies, the torque accuracy of the motor system 100 was diminished, particularly at low speeds. The embodiments estimate a stator resistance at a DC condition and calculate the output voltage 115 using the stator resistance at the DC condition to improve the torque accuracy of the motor 101 as will be described hereafter.

Figure 1B:
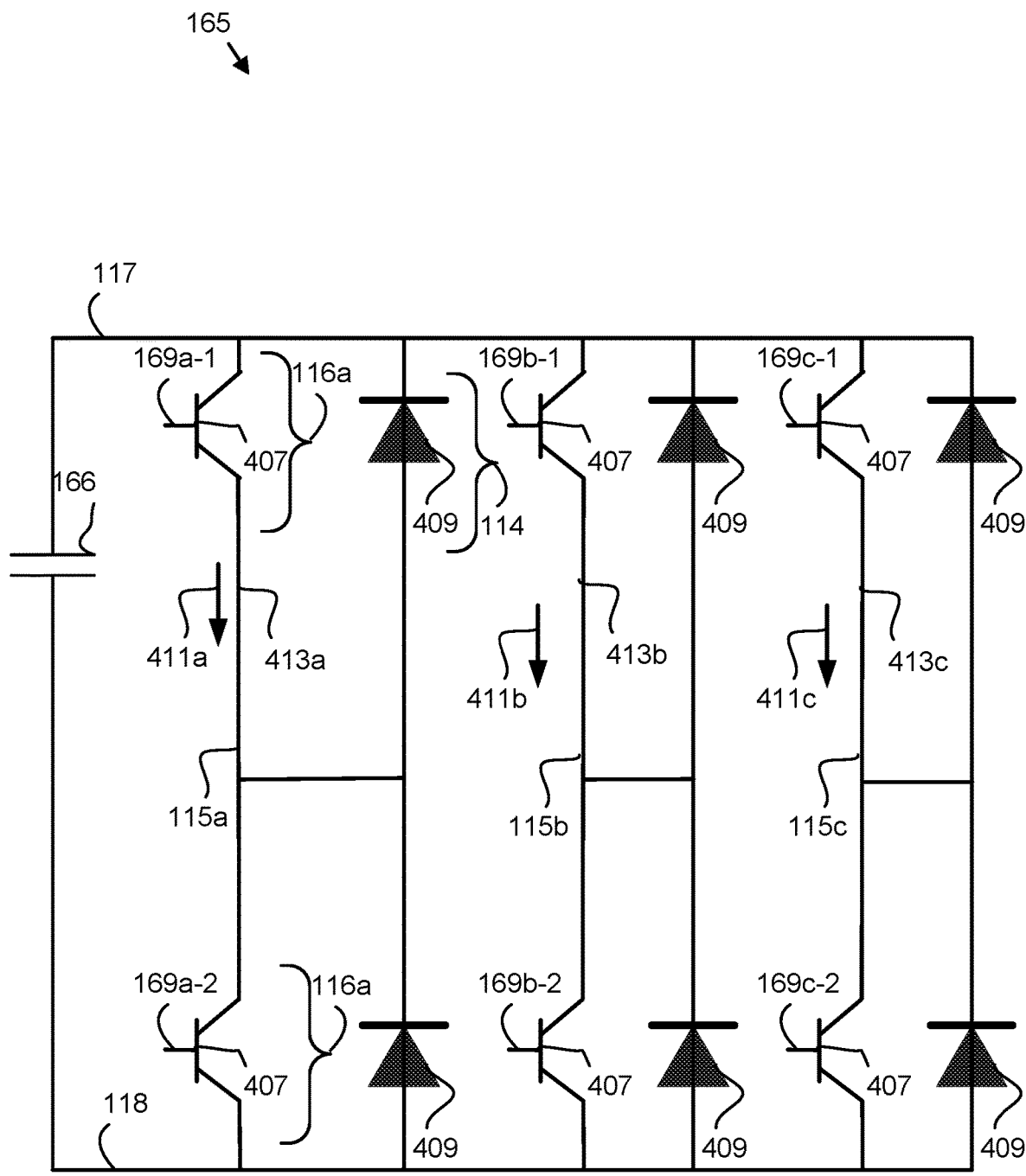
FIG. 1B is a schematic diagram of an inverter according to an embodiment.

FIG. 1B is a schematic diagram of the inverter 165. The inverter 165 includes a plurality of gates 407 and diodes 409. The gates 407 may be insulated-gate bipolar transistors (IGBT). The gate signals 169 turn the gates 407 on and off to generate the output voltages 115a-c for the plurality of coils 103a-c. The output voltages 115 have output currents 413 with an output current direction 411. The output current 413 and output current direction 411 may be measured. Each gate 407 may have a collector to emitter voltage drop $V_{CE}$ 116. In addition, each diode 409 may have diode voltage drop 114.

Figure 1C:
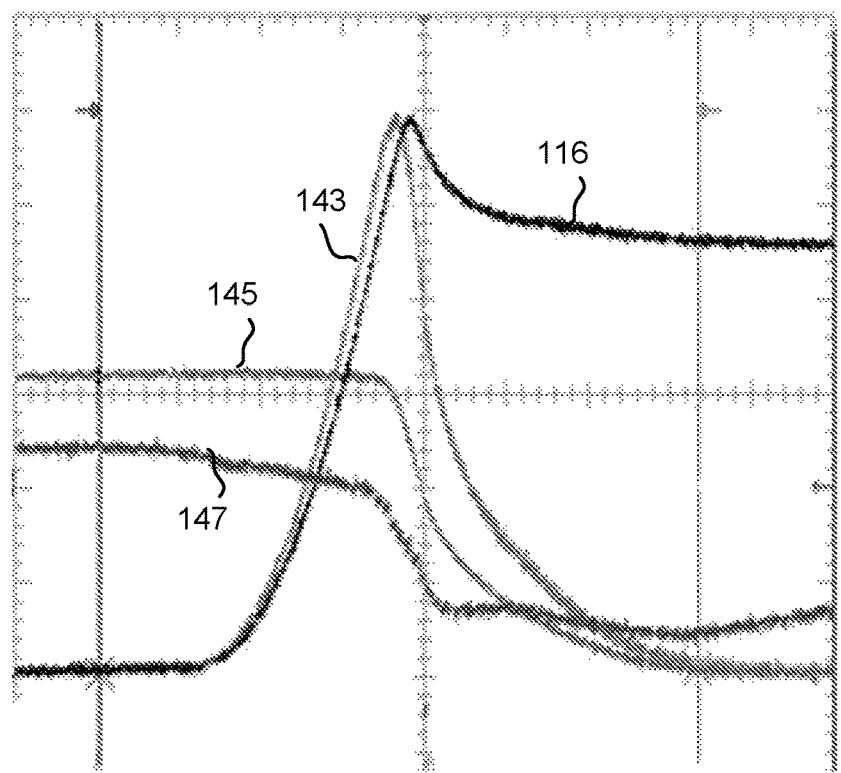
FIG. 1C is a graph of an inverter turn off waveform according to an embodiment.

FIG. 1C is a graph of an inverter turn off waveform. The graph shows a collector to emitter voltage drop 116 when a gate 407 is turned off by a gate signal 169. The gate voltage 145, gate current 147, and switching loss 143 are also shown. The output voltage 115 is difficult to predict because the collector to emitter voltage drop 116 is not linear and is heavily dependent on inverter parasitics, motor cable type, motor cable length, and motor winding construction. The embodiments estimate a stator resistance measured at the DC condition and set a dynamic compensation based on the stator resistance. As a result, the nonlinear properties of the inverter 165 are compensated for as will be described hereafter.

Figure 1D:
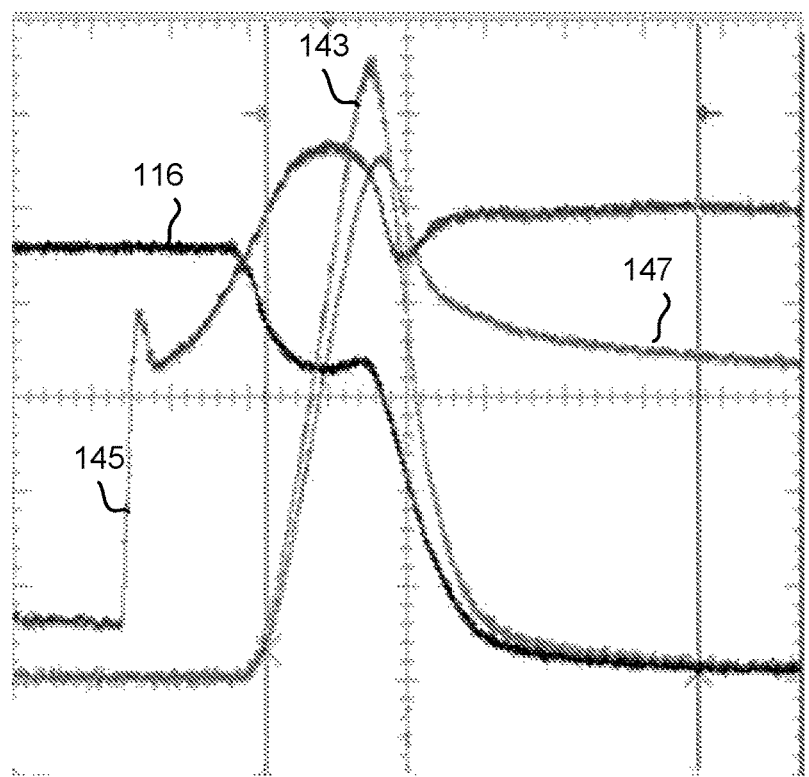
FIG. 1D is a graph of an inverter turn on waveform according to an embodiment.

FIG. 1D is a graph of an inverter turn on waveform. The graph shows a collector to emitter voltage drop 116 when a gate 407 is turned on by a gate signal 169. The gate voltage 145, gate current 147, and switching loss 143 are also shown. The output voltage 115 is difficult to predict because the collector to emitter voltage drop 116 is not linear and is heavily dependent on inverter parasitics, motor cable type, motor cable length, and motor winding construction.

The embodiments estimate the output voltage 115 using the DC bus voltage 117 and a duty cycle for the motor drive 161 at least two switching frequencies. The embodiments further calculate at least two stator resistances for the switching frequencies and estimate a stator resistance measured at a DC condition based on the switching frequencies. The embodiments employ the stator resistance to set a dynamic compensation. The dynamic compensation may mitigate poor errors of stator resistance accuracy caused by the nonlinear properties of the inverter 165 as will be described hereafter. In one embodiment, the dynamic compensation mitigates the gate voltage drop Vce 116 and/or diode voltage drop Vf 114.

Figure 1E:
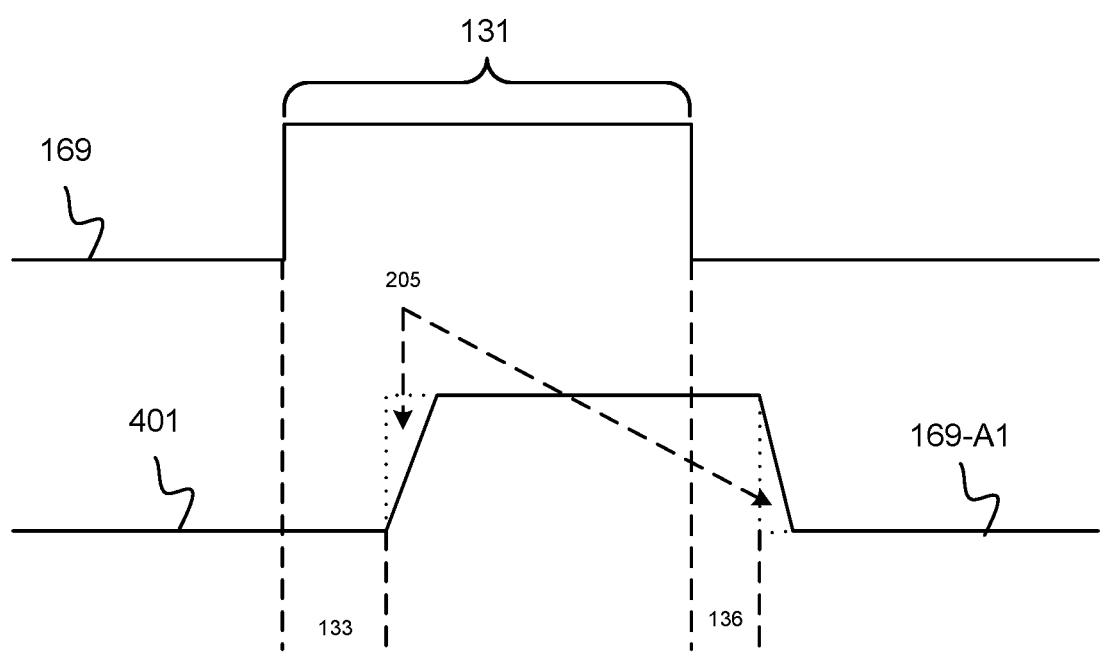
FIG. 1E is a graph of compensated control signals according to an embodiment.

FIG. 1E is a graph of compensated control signals. For clarity, differences are not to scale. A gate signal 169 and a gate signal transition 401 are shown. The gate signal 169 has a pulse width 131. In addition, switch ON delays 133 and switch OFF delays 136 further modify the gate voltage drops 116 relative to the gate signal 169. As a result, gate signal 169-A1 is not aligned with the gate signal 169. The embodiments determine the dynamic compensations 205 to mitigate the nonlinear properties of the inverter 165.

Figure 2:
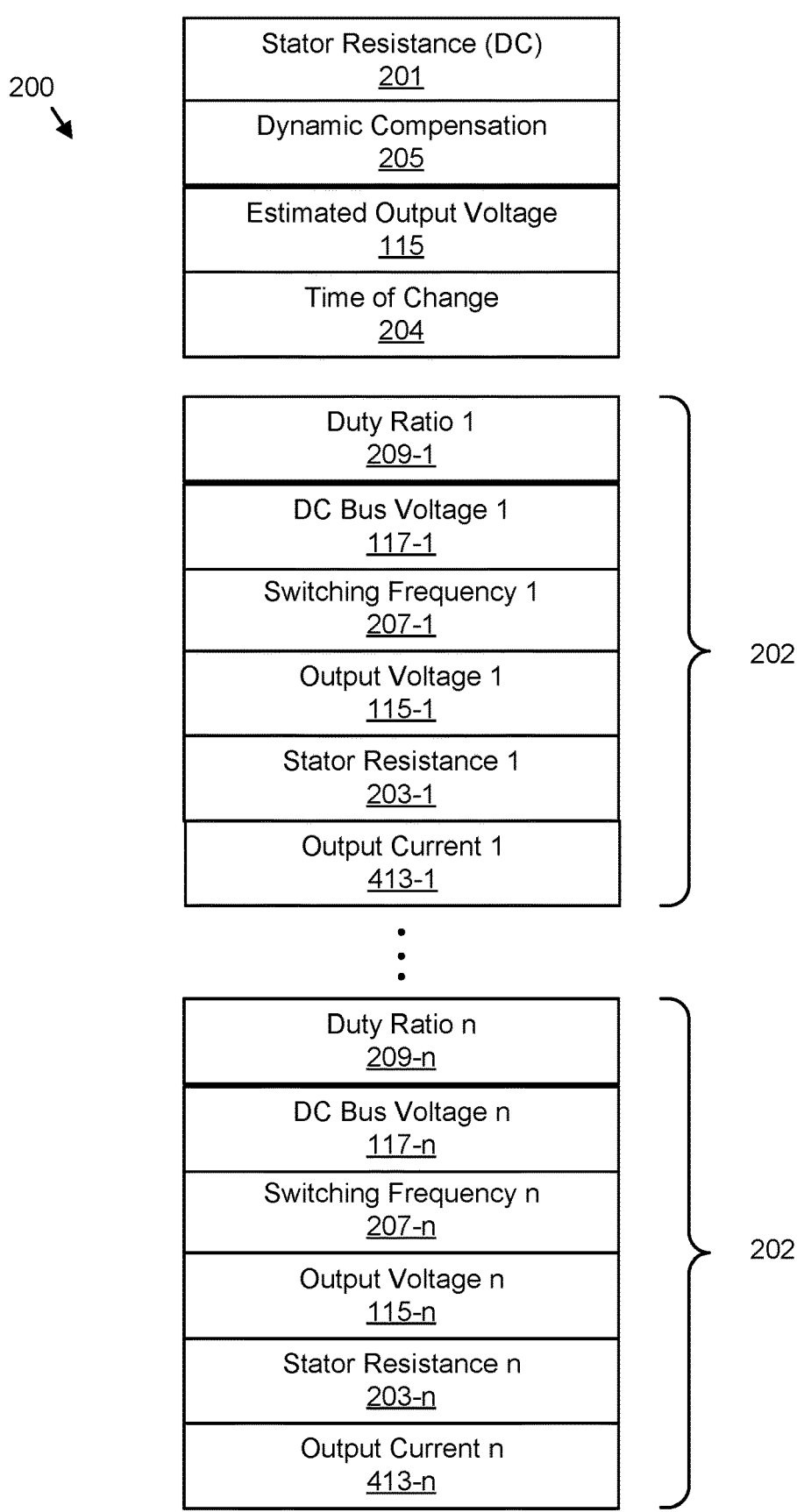
FIG. 2 is a schematic block diagram of motor data according to an embodiment.

FIG. 2 is a schematic block diagram of motor data 200. The motor data 200 may be used to set the dynamic compensation 205 and/or estimate the output voltage 115. The motor data 200 may be organized as a data structure in a memory. In the depicted embodiment, the motor data 200 includes a stator resistance 201 at a DC condition, the dynamic compensation 205, and an estimated output voltage 115. In one embodiment, the motor data 200 includes a time of the change 204. The time of change 204 may record a time when the output current direction 411 changes after a gate signal transition 401 for a gate signal 169.

In addition, the motor data 200 includes a plurality of frequency records 202. Each frequency record 202 may include a duty ratio 209 for the motor drive 161, a DC bus voltage 117, a switching frequency 207 of the motor drive 161, an output voltage 115, a stator resistance 203, and the output current 413.

The stator resistance 201 measured at the DC condition may be estimated using the frequency records 202 as will be described hereafter. The estimated output voltage 115 may be estimated from the DC bus voltage 117 and a duty ratio 209 for the motor drive 161 at least two switching frequencies 207. The switching frequency 207 may be a frequency of Pulse Width Modulation (PWM) switching by the inverter 165. In one embodiment, each frequency record 202 is used to estimate the estimated output voltage 115.

Each duty ratio 209 in the frequency record 202 may record the duty ratio 209 for the motor drive 161 at the corresponding switching frequency 207. Each DC bus voltage 117 may record the DC bus voltage 117 for the motor drive 161 at the corresponding switching frequency 217. Each switching frequency 207 in the frequency record 202 records the switching frequency 207 of the motor drive 161. Each output voltage 115 in the frequency record 202 may record the output voltage 115 for the corresponding switching frequency 207. Each stator resistance 203 in the frequency record 202 may be calculated based on the corresponding duty ratio 209, DC bus voltage 117, and/or output voltage 115.

Figure 3:
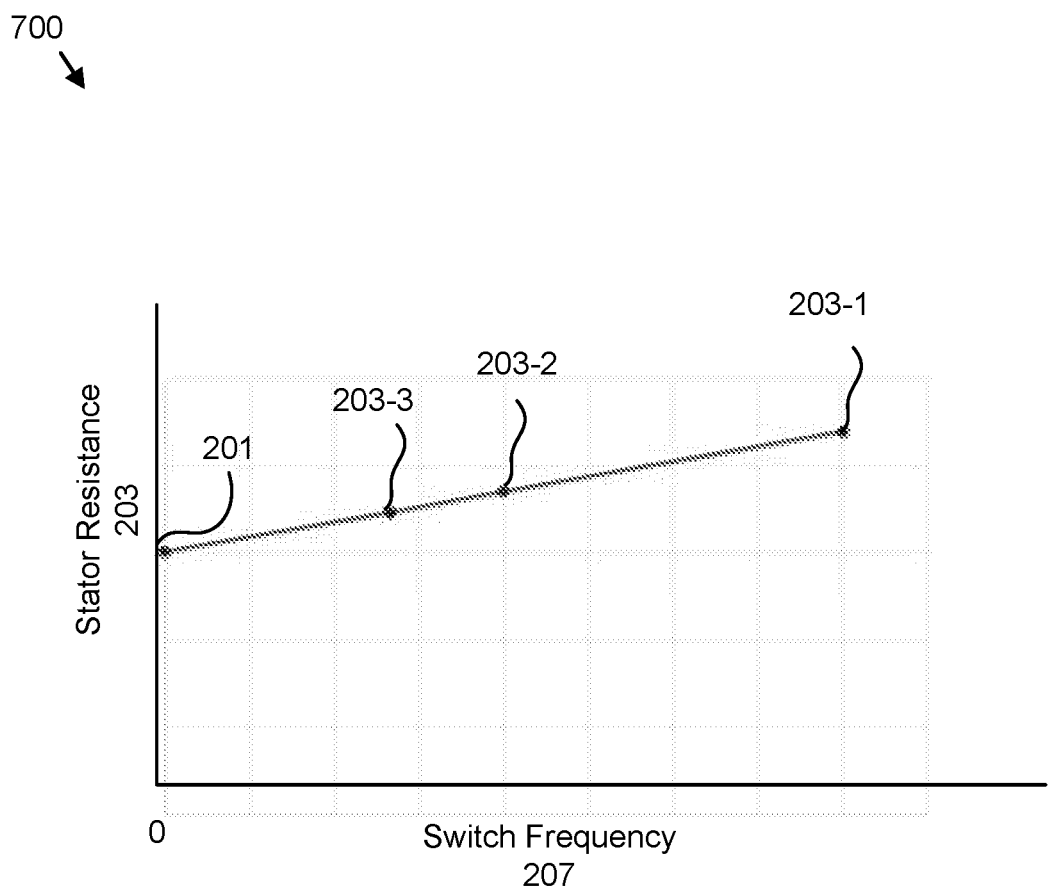
FIG. 3 is a graph of estimating stator resistance according to an embodiment.

FIG. 3 is a graph of estimating the stator resistance 201 at a DC condition. In the depicted embodiment, a plurality of stator resistances 203 corresponding to a plurality of switching frequencies 207 are shown. In one embodiment, the stator resistance 201 at a DC condition is estimated as a linear regression of at least two of the stator resistances 203. The stator resistance 201 may also be estimated using curve fitting and/or an equation.

FIG. 4 is a schematic block diagram of the controller 150. In the depicted embodiment, the controller 150 includes a processor 405, a memory 410, and communication hardware 415. The memory 410 may store code and data such as the motor data 200. The processor 405 may execute the code and process the data. The communication hardware 415 may communicate with other devices.

Figure 5:
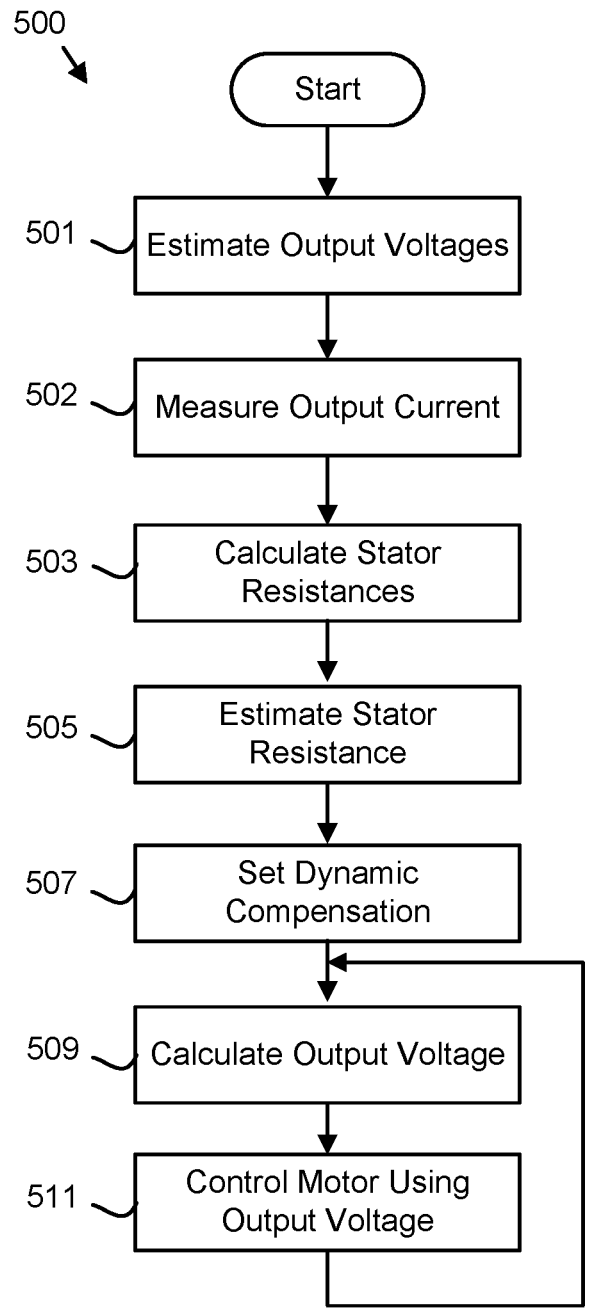
FIG. 5 is a schematic flow chart diagram of a motor control method according to an embodiment.

FIG. 5 is a schematic flow chart diagram of a motor control method 500. The method 500 may set the dynamic compensation 205. In addition, the method 500 may dynamically calculate the output voltage 115 based on the stator resistance 201 and control the motor 101 using the calculated output voltage 115. The method 500 may be performed by the processor 405.

The method 500 starts, and in one embodiment, the processor 405 estimates 501 an output voltage 115 using the DC bus voltage $V_{DC}$ 117 and the duty ratio DR 209 for the motor drive 161 at a first switching frequency 207-1 and at least one second switching frequency 207-2. Each output voltage $V_O$ 115 may be estimated 501 using Equation 1.

$$V_O = V_{DC} * DR \qquad \text{Equation 1}$$

In one embodiment, the DC bus voltage 117, the duty ratio 209, the switching frequency 207, and the output voltage 115 are recorded in a frequency record 202 for each switching frequency 207.

In addition, the processor 405 may measure 502 the output current 413 at the first switching frequency 207-1 and the at least one second switching frequency 207-2.

The processor 405 may further calculate 503 a first stator resistance 203-1 for the first switching frequency 207-1 and at least one second stator resistance 203-2 for the at least one second switching frequency 207-2. In one embodiment, the processor 405 calculates 503 at least two stator resistances 203. The stator resistances $R_S$ 203 may be calculated using Equation 2, where $I_O$ is the output current 413.

$$R_S = V_O / I_O \qquad \text{Equation 2}$$

The processor 405 may estimate 505 the stator resistance 201 at a DC condition. In one embodiment, the stator resistance $R_S$ 201 at the DC condition is estimated using a linear regression based on the first stator resistance 203-1 and the at least one second stator resistance 203-2 such as is illustrated in FIG. 3. In addition, the stator resistance $R_S$ 201 at the DC condition may be estimated using curve fitting based on the first stator resistance 203-1 and the at least one second stator resistance 203-2. In a certain embodiment, the stator resistance $R_S$ 201 at the DC condition is estimated using Equation 3, where $R_1$ is the first stator resistance 203-1, $R_2$ is a second stator resistance 203-2, $F_1$ is the first switching frequency 207-1, and $F_2$ is the second switching frequency 207-2.

$$R_s = R_2 + \frac{-F_2}{F_1 - F_2}(R_1 - R_2) \qquad \text{Equation 3}$$

The processor 405 may set 507 the dynamic compensation 205 based on a stator resistance error between the first switching frequency and the at least one second switching frequency.

In one embodiment, the dynamic compensation $T_d$ 205 is set 507 using Equation 4, wherein $T_S$ is the dynamic transition equivalent time during the gate signal transition 401, $T_{ON}$ is the switch ON delay 133, and $T_{OFF}$ is the switch OFF delay 136.

$$T_d = T_S + T_{ON} - T_{OFF} \qquad \text{Equation 4}$$

In one embodiment, the dynamic compensation 205 modifies gate signals 169 for the inverter 165. In one embodiment, the dynamic compensation 205 compensates for nonlinearities in the collector to emitter voltage drop 116 and/or the diode voltage drop 114.

The processor 405 may dynamically calculate 509 the output voltage 115 based on the stator resistance 201 at the DC condition. The output voltage 115 may be dynamically calculated 509 during operation of the motor 101. In one embodiment, the output voltage $V_O$ 115 is calculated for Equation 5, wherein $R_S$ is the stator resistance 201 at the DC condition and $I_O$ is the output current 413.

$$V_O = I_O * R_S \qquad \text{Equation 5}$$

The processor 405 may further dynamically control 511 the motor 101 using the calculated output voltage 115. Controlling 511 the motor 101 using the calculated output voltage 115 and/or dynamic compensation 205 may significantly improve torque accuracy for the motor 101.

PROBLEM/SOLUTION

The output voltage 115 is difficult to predict because the collector to emitter voltage drop 116 is not linear and is heavily dependent on inverter parasitics. Because the output voltage 115 cannot be accurately predicted, the torque accuracy of the motor system 100 may be diminished, particularly at low speeds. In the past, voltage sensing circuits have been used to measure the output voltage 115. However, voltage sensing circuits increase the cost of the motor system 100.

The embodiments estimate a stator resistance 201 at the DC condition and set a dynamic compensation 205 based on the stator resistance 201. As a result, the nonlinear properties of the inverter 165 are compensated for. Using the dynamic compensation 205 and an output voltage 115 calculated from the stator resistance 201, the embodiments reduce torque errors and improve torque accuracy, improving the efficiency of the motor system 100.

This description uses examples to disclose the invention and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method comprising:
    estimating, by use of a processor, an estimated output voltage using a Direct Current (DC) bus voltage and a duty ratio for a motor drive at a first switching frequency and at least one second switching frequency;
    measuring a measured output current at the first switching frequency and the at least one second switching frequency;
    calculating a first stator resistance for the first switching frequency and at least one second stator resistance for the at least one second switching frequency;
    estimating a stator resistance at a DC condition based on the first stator resistance and the at least one second stator resistance;
    setting a dynamic compensation based on a stator resistance error between the first switching frequency and the at least one second switching frequency,
    dynamically calculating a calculated output voltage based on the stator resistance at the DC condition and the output current; and
    controlling the motor using the calculated output voltage and the dynamic compensation.

2. The method of claim 1, wherein the stator resistance at the DC condition is estimated using a linear regression based on the first stator resistance and the at least one second stator resistance.

3. The method of claim 1, wherein the stator resistance at the DC condition is estimated using curve fitting based on the first stator resistance and the at least one second stator resistance.

4. The method of claim 1, wherein the stator resistance at the DC condition is estimated as $$R_s = R_2 + \frac{-F_2}{F_1 - F_2}(R_1 - R_2),$$

where $R_1$ is the first stator resistance, $R_2$ is a second stator resistance, $F_1$ is the first switching frequency, and $F_2$ is the second switching frequency.

5. The method of claim 1, wherein the dynamic compensation $T_d$ is calculated as $T_d = T_S + T_{ON} - T_{OFF}$, wherein $T_S$ is a dynamic transition equivalent time during a gate signal transition, $T_{ON}$ is a switch ON delay, and $T_{OFF}$ is a switch OFF delay.

6. The method of claim 1, wherein the dynamic compensation modifies gate signals for an inverter.

7. The method of claim 1, wherein the dynamic compensation compensates for a gate voltage drop and a diode voltage drop.

8. An apparatus comprising:
    a processor;
    a memory storing code executable by the processor to perform:
    estimating an estimated output voltage using a Direct Current (DC) bus voltage and a duty ratio for a motor drive at a first switching frequency and at least one second switching frequency;
    measuring a measured output current at the first switching frequency and the at least one second switching frequency;

calculating a first stator resistance for the first switching frequency and at least one second stator resistance for the at least one second switching frequency;

estimating a stator resistance at a DC condition based on the first stator resistance and the at least one second stator resistance;

setting a dynamic compensation based on a stator resistance error between the first switching frequency and the at least one second switching frequency;

dynamically calculating a calculated output voltage based on the stator resistance at the DC condition and the output current; and controlling the motor using the calculated output voltage and the dynamic compensation.

9. The apparatus of claim 8, wherein the stator resistance at the DC condition is estimated using a linear regression based on the first stator resistance and the at least one second stator resistance.

10. The apparatus of claim 8, wherein the stator resistance at the DC condition is estimated using curve fitting based on the first stator resistance and the at least one second stator resistance.

11. The apparatus of claim 8, wherein the stator resistance at the DC condition is estimated as $$R_s = R_2 + \frac{-F_2}{F_1 - F_2}(R_1 - R_2),$$

where $R_1$ is the first stator resistance, $R_2$ is a second stator resistance, $F_1$ is the first switching frequency, and $F_2$ is the second switching frequency.

12. The apparatus of claim 11, wherein the dynamic compensation $T_d$ is calculated as $T_d = T_S + T_{ON} - T_{OFF}$, wherein $T_S$ is a dynamic transition equivalent time during a gate signal transition, $T_{ON}$ is a switch ON delay, and $T_{OFF}$ is a switch OFF delay.

13. The apparatus of claim 8, wherein the dynamic compensation modifies gate signals for an inverter.

14. The apparatus of claim 8, wherein the dynamic compensation compensates for a gate voltage drop and a diode voltage drop.

15. A non-transitory computer readable storage medium having program code embodied therein, the program code readable/executable by a to perform:

estimating an output voltage using a Direct Current (DC) bus voltage;

measuring an output current at the first switching frequency and the at least one second switching frequency;

calculating a first stator resistance for the first switching frequency and at least one second stator resistance for the at least one second switching frequency;

estimating a stator resistance at a DC condition based on the first stator resistance and the at least one second stator resistance; and setting a dynamic compensation based on a stator resistance error between the first switching frequency and the at least one second switching frequency;

dynamically calculating a calculated output voltage based on the stator resistance at the DC condition and the output current, and controlling the motor using the calculated output voltage and the dynamic compensation.

16. The computer program product of claim 15, wherein the stator resistance at the DC condition is estimated using a linear regression based on the first stator resistance and the at least one second stator resistance.

17. The computer program product of claim 15, wherein the stator resistance at the DC condition is estimated using curve fitting based on the first stator resistance and the at least one second stator resistance.

18. The computer program product of claim 15, wherein the stator resistance $R_S$ at the DC condition is estimated using a calculation selected from the group consisting of a linear regression based on the first stator resistance and the at least one second stator resistance, a curve fitting based on the first stator resistance and the at least one second stator resistance, and $$R_s = R_2 + \frac{-F_2}{F_1 - F_2}(R_1 - R_2),$$

where $R_1$ is the first stator resistance, $R_2$ is a second stator resistance, $F_1$ is the first switching frequency, and $F_2$ is the second switching frequency.

19. The computer program product of claim 15, wherein the dynamic compensation $T_d$ is calculated as $T_d = T_S + T_{ON} - T_{OFF}$, wherein $T_S$ is a dynamic transition equivalent time during a gate signal transition, $T_{ON}$ is a switch ON delay, and $T_{OFF}$ is a switch OFF delay.

20. The computer program product of claim 15, wherein the dynamic compensation modifies gate signals for an inverter.

* * * * *